United States Patent
Lewis et al.

(10) Patent No.: US 7,508,231 B2
(45) Date of Patent: Mar. 24, 2009

(54) PROGRAMMABLE LOGIC DEVICE HAVING REDUNDANCY WITH LOGIC ELEMENT GRANULARITY

(75) Inventors: David Lewis, Toronto (CA); David Cashman, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/739,055

(22) Filed: Apr. 23, 2007

(65) Prior Publication Data

US 2008/0218197 A1    Sep. 11, 2008

Related U.S. Application Data

(63) Continuation-in-part of application No. 11/684,424, filed on Mar. 9, 2007.

(51) Int. Cl.
*H03K 19/177* (2006.01)
(52) U.S. Cl. .............. 326/10; 326/38; 326/39; 326/41; 326/19; 326/177
(58) Field of Classification Search ........... 326/10, 326/39–41
See application file for complete search history.

(56) References Cited

U.S. PATENT DOCUMENTS

| | | | |
|---|---|---|---|
| 4,706,216 A | 11/1987 | Carter | |
| 4,758,985 A | 7/1988 | Carter | |
| 5,260,610 A | 11/1993 | Pedersen et al. | |
| 5,331,226 A | 7/1994 | Goetting | |
| 5,352,940 A | 10/1994 | Watson | |
| 5,399,922 A | 3/1995 | Kiani et al. | |
| 5,438,295 A | 8/1995 | Reddy et al. | |
| 5,488,316 A | 1/1996 | Freeman et al. | |
| 5,689,195 A | 11/1997 | Cliff et al. | |
| 5,815,003 A | 9/1998 | Pedersen | |
| 5,821,773 A | 10/1998 | Norman et al. | |
| 5,831,448 A | 11/1998 | Kean | |
| 5,835,998 A | 11/1998 | Pedersen | |
| 5,850,152 A | 12/1998 | Cliff et al. | 326/40 |
| 5,920,202 A | 7/1999 | Young et al. | |
| 5,923,185 A | 7/1999 | Zhou | |
| 5,953,537 A | 9/1999 | Balicki et al. | |
| 5,999,015 A | 12/1999 | Cliff et al. | |

(Continued)

FOREIGN PATENT DOCUMENTS

WO    WO98/38741    3/1998

OTHER PUBLICATIONS

Lane et al., U.S. Appl. No. 10/159,581, filed May 30, 2002.

(Continued)

*Primary Examiner*—Vibol Tan
(74) *Attorney, Agent, or Firm*—Weaver Austin Villeneuve Sampson LLP

(57) ABSTRACT

A PLD having logic element row granularity redundancy is disclosed. The PLD includes a plurality of LABs arranged in an array and a plurality of horizontal and vertical inter-LAB lines interconnecting the LABs of the array. Each of the LABs further includes a predetermined number of logic elements and redundancy circuitry to replace a defective logic element with a non-defective logic element among the predetermined logic elements by shifting programming data intended to for the defective logic element to the non-defective logic element.

18 Claims, 7 Drawing Sheets

U.S. PATENT DOCUMENTS

| | | | |
|---|---|---|---|
| 5,999,016 A | 12/1999 | McClintock et al. | |
| 6,020,756 A | 2/2000 | New | |
| 6,034,540 A | 3/2000 | Mendel | |
| 6,051,992 A | 4/2000 | Young et al. | |
| 6,066,960 A | 5/2000 | Pedersen | |
| 6,069,487 A | 5/2000 | Lane et al. | |
| 6,069,490 A | 5/2000 | Orchotta et al. | 326/41 |
| 6,084,427 A | 7/2000 | Lee et al. | |
| 6,094,065 A | 7/2000 | Tavana et al. | |
| 6,107,822 A | 8/2000 | Mendel et al. | |
| 6,118,300 A | 9/2000 | Wittig et al. | |
| 6,122,720 A | 9/2000 | Cliff | |
| 6,124,731 A | 9/2000 | Young et al. | |
| 6,133,751 A | 10/2000 | Churcher et al. | 326/49 |
| 6,166,559 A * | 12/2000 | McClintock et al. | 326/10 |
| 6,167,558 A | 12/2000 | Trimberger | |
| 6,184,707 B1 | 2/2001 | Norman et al. | |
| 6,191,610 B1 | 2/2001 | Wittig et al. | |
| 6,201,404 B1 | 3/2001 | Reddy et al. | |
| 6,201,410 B1 | 3/2001 | New et al. | |
| 6,211,696 B1 | 4/2001 | Skahill et al. | |
| 6,249,149 B1 | 6/2001 | Pedersen | |
| 6,255,846 B1 | 7/2001 | Lee et al. | |
| 6,271,680 B1 | 8/2001 | Mendel et al. | |
| 6,275,065 B1 | 8/2001 | Mendel | |
| 6,323,677 B1 | 11/2001 | Lane et al. | |
| 6,323,682 B1 | 11/2001 | Bauer et al. | |
| 6,344,755 B1 | 2/2002 | Reddy et al. | |
| 6,362,648 B1 | 3/2002 | New et al. | |
| 6,400,180 B2 | 6/2002 | Wittig et al. | |
| 6,538,470 B1 | 3/2003 | Langhammer et al. | 326/41 |
| 6,545,501 B1 * | 4/2003 | Bailis et al. | 326/10 |
| 6,965,249 B2 | 11/2005 | Lane et al. | |
| 6,970,014 B1 | 11/2005 | Lewis et al. | |
| 7,061,268 B1 | 6/2006 | Lee et al. | 326/39 |
| 7,180,324 B2 | 2/2007 | Chan et al. | |
| 7,215,140 B1 * | 5/2007 | Saini et al. | 326/41 |
| 7,218,133 B2 | 5/2007 | Lewis et al. | 326/10 |
| 2002/0157071 A1 * | 10/2002 | Schiefele et al. | 716/6 |
| 2003/0072185 A1 * | 4/2003 | Lane et al. | 365/189.02 |
| 2003/0201793 A1 * | 10/2003 | Nguyen et al. | 326/41 |

OTHER PUBLICATIONS

Lewis et al., U.S. Appl. No. 11/684,424, filed Mar. 9, 2007.

"The Stratix Architecture, Functional Description," pp. 2-1 through 2-140, from the Altera Corporation, Jul. 2005 (Altera Internal document No. S51002-3.2).

"The Stratix® PII Architecture, Functional Description," pp. 2-104, The Stratix® II Device handbook, vol. 1, Dec. 2005 (Altera Document No. SII51002.4.0).

EPO Search Report mailed Jul. 9, 2008 in related European Application No. 08003479.6, 4 pages.

USPTO Office Action mailed Mar. 4, 2008 in related U.S. Appl. No. 11/684,424, 11 pages.

* cited by examiner

PROGRAMMABLE LOGIC DEVICE HAVING REDUNDANCY WITH LOGIC ELEMENT GRANULARITY

CROSS-REFERENCE TO RELATED APPLICATIONS

This application is a Continuation-in-Part of U.S. patent application Ser. No. 11/684,424, filed Mar. 9, 2007, and entitled "A PROGRAMMABLE LOGIC DEVICE HAVING LOGIC ARRAY BLOCK INTERCONNECT LINES THAT CAN INTERCONNECT LOGIC ELEMENTS IN DIFFERENT LOGIC BLOCKS", which is hereby incorporated by reference herein.

BACKGROUND

1. Field of the Invention

The present invention generally relates to Programmable Logic Devices (PLDs) having an array of Logic Array Blocks, each including a plurality of logic elements, and more particularly, to a PLD having redundancy with logic element granularity.

2. Description of Related Art

A Programmable Logic Device (PLD) is a semiconductor integrated circuit that contains fixed logic circuitry that can be programmed to perform a host of logic functions. In the semiconductor industry, PLDs are becoming increasingly popular for a number of reasons. Due to the advances of chip manufacturing technology, application specific integrated circuits (ASICs) designs have become incredibly complex. This complexity not only adds to design costs, but also the duration of time needed to develop an application specific design. To compound this problem, product life cycles are shrinking rapidly. As a result, it is often not feasible for original equipment manufacturers (OEMs) to design and use ASICs. OEMs are therefore relying more and more on PLDs. The same advances in fabrication technology have also resulted in PLDs with improved density and speed performance. Sophisticated programming software enables complex logic functions to be rapidly developed for PLDs. Furthermore, logic designs generally can also be easily migrated from one generation of PLDs to the next, further reducing product development times. The closing of the price-performance gap with ASICs and reduced product development times makes the use of PLDs compelling for many OEMs.

Most PLDs have a chip architecture including a two-dimensional array of logic blocks. Row and column inter-logic block lines, typically of varying length and speed, provide signal and clock interconnects between the blocks of logic in the array. The blocks of logic are often referred to by various names, for example as Logic Array Blocks or LABs by the Altera Corporation, assignee of the present application, or Configurable Logic Blocks (CLBs), as used by Xilinx Corporation. In the Altera architectures, the LABs are further broken into a plurality of individual logic elements referred to as Logic Elements (LEs) or Adaptive Logic Modules (ALMs). With the Xilinx architecture, the CLBs also include a group of logic elements called Logic Cells or (LCs). The LEs, LCs, or ALMS each typically include such elements as look up tables (LUTs), registers for generating registered outputs, adders and other circuitry to implement various logic and arithmetic functions. For the sake of simplicity, any block of logic containing multiple LEs, LCs or ALMs, regardless if organized into a LAB or CLBs, is hereafter generically referred to as a "LABs". In no way should the term "LAB" be construed as limiting the present invention to a particular PLD architecture and is intended to cover any PLD architecture that uses any type of logic elements grouped together in a block.

PLD interconnects includes at least two levels: (i) inter-LAB lines that provide the routing between LABs; and (ii) an intra-LAB lines that provide routing within the LABs. For a detailed explanation of a two level interconnect hierarchy for a PLD, see U.S. Pat. No. 6,970,014, incorporated herein for all purposes.

PLDs having redundancy can help improve production yields by providing redundant circuitry that can be used in place of defective circuitry on the device. In a row based redundancy scheme for example, at least one spare row of logic is provided for a designated region of logic. In the event a defect is detected in one of the rows of the region, the programming data used to configure the PLD with the user's design is altered to bypass the defective row. In other words, each subsequent row after the defect replaces the row below it, and the last logic row is shifted to the redundant row. In this manner, the defective row is bypassed and replaced with the redundant row. For examples of redundancy for PLDs, see U.S. Pat. Nos. 6,201,404, 6,344,755, 6,965,249 and 7,180,324, each assigned to the assignee of the present application and each incorporated herein by reference for all purposes.

There are several issues associated with using redundancy on a PLD. One issue is the added cost of adding the redundant logic, which occupies space on the die, but is not available for implementing the user's circuit design. For example, consider a PLD divided into five regions, each including twenty rows. To implement redundancy, each region is required to dedicate at least one redundant row. Therefore, of the one hundred rows in the device, five are spare rows needed to implement redundancy. In this example, implementing redundancy represents a five percent (5%) penalty. A second issue involves connectivity. In order to insure that each row can act as a replacement for the adjacent row, it is necessary to include extra routing switches that are not visible to the user, so that each row can access signals that are both visible to the user and signals that would only be required when implementing row shifting for redundancy. Further, the extra routing switches need to extend beyond the nominal length of the wire by the amount of the physical shift used by the redundancy scheme.

Current redundancy schemes have a row granularity of one LAB. In other words, each logic region includes an extra row of LABs for redundancy. Since each LAB row includes a relatively large number of logic elements and other circuitry, a redundancy scheme having a row granularity of a LAB represents a fairly significant penalty with regard to the overall amount of logic available on the chip. Row granularity of one LAB also creates an interconnect issue. Extending the length of inter-LAB lines by one LAB also creates propagation delays, particularly when staggered inter-LAB lines are used.

A PLD with redundancy having logic element row granularity within each logic region is therefore needed.

SUMMARY OF THE INVENTION

A PLD having logic element row granularity redundancy is disclosed. The PLD includes a plurality of LABs arranged in an array and a plurality of horizontal and vertical inter-LAB lines interconnecting the LABs of the array. Each of the LABs further includes a predetermined number of logic elements and redundancy circuitry to replace a defective logic element with a non-defective logic element among the predetermined logic elements by shifting programming data intended for the defective logic element to the non-defective logic element.

BRIEF DESCRIPTION OF THE DRAWINGS

The invention may best be understood by reference to the following description taken in conjunction with the accompanying drawings, which illustrate specific embodiments of the present invention.

It should be noted that like reference numbers refer to like elements in the figures.

DETAILED DESCRIPTION OF SPECIFIC EMBODIMENTS

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention. Further, it should be noted that the techniques of the present invention could be applied to a variety of systems or electronic devices such as programmable devices and application-specific integrated circuit (ASIC) devices.

Figure 1:
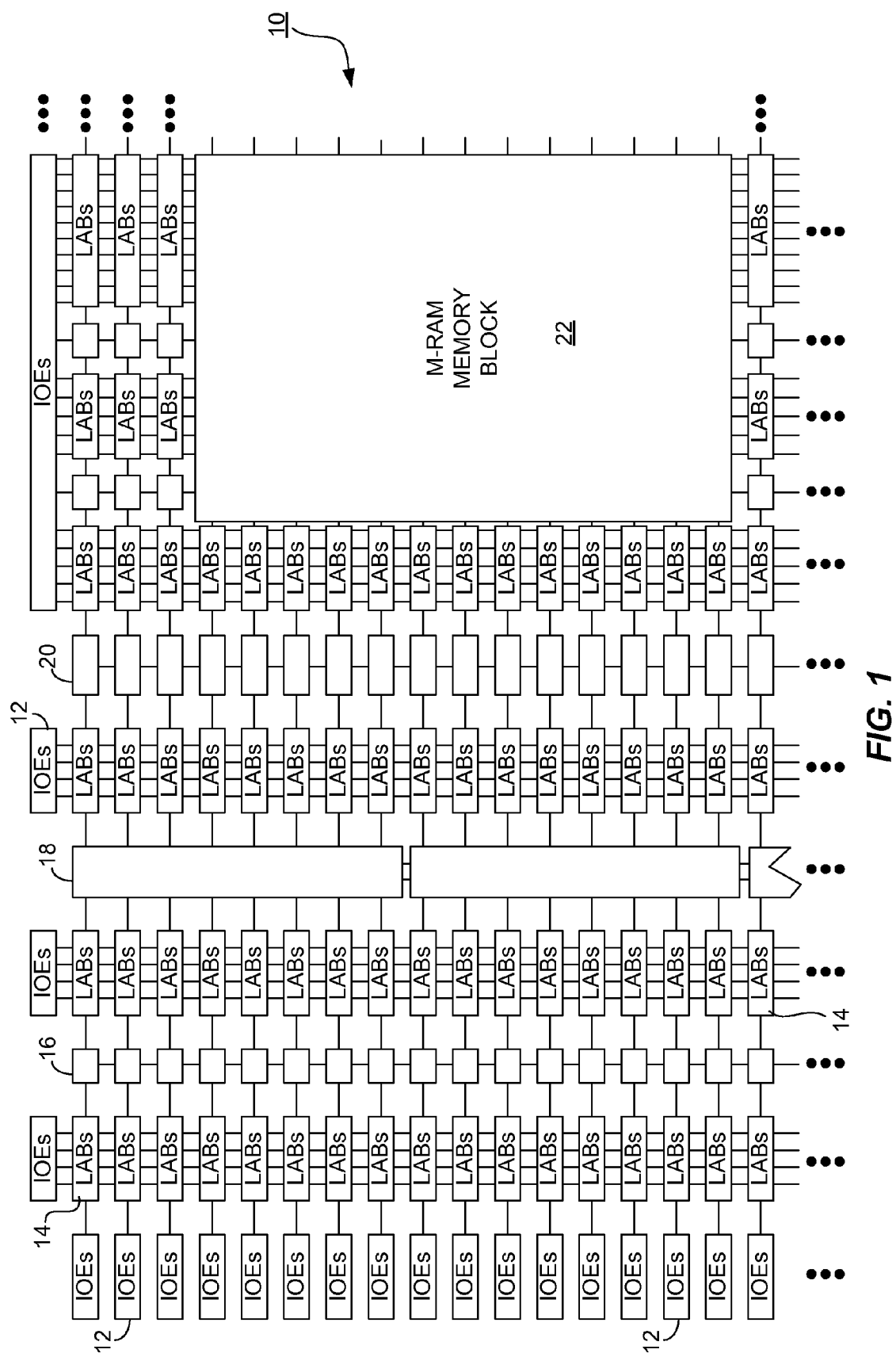
FIG. 1 is a block diagram of a Programmable Logic Device (PLD) architecture in accordance with the present invention.

Referring to FIG. 1, a block diagram of a Programmable Logic Device (PLD) of the present invention is shown. The PLD 10 includes a two dimensional row and column based architecture including a plurality of Input/Output elements (IOEs) 12 arranged around the periphery of the chip, a plurality of Logic Array Blocks (LABs) 14 grouped into rows and columns across the device, Random Access Memory (RAM) blocks 16 grouped into columns between certain LABs 14, Digital Signal Processing (DSP) blocks 18 grouped into columns across the device, second RAM blocks 20 also grouped into columns across the device and between certain LABs 14, and one or more M-RAM memory blocks 22, each provided at different locations across the device.

The LABs 14 include a predetermined number of logic elements (not visible in the figure). In various embodiments, the number of logic elements may vary from two to sixteen or more. The RAM blocks 16 are simple dual port memory blocks with a predetermined number of bits and additional parity bits. The RAM blocks 16 provide dedicated simple dual port or single port memory for the device. The DSP blocks 18 are provided for performing digital signal processing functions, such as for example, finite impulse response (FIR) and infinite impulse response (IIR) filters. The second RAM blocks 20 are true dual port memory blocks with memory bits and parity bits. Finally, the M-RAM memory blocks 22 are large true dual port memory blocks with both memory and parity bits. It should be noted that the PLD 10 is merely exemplary and in no way should be construed as limiting the invention. It should also be noted that the practice of the present invention, as described herein, does not require a PLD with all the above-mentioned functional blocks, listed above. Functional blocks such as the RAM blocks 16, DSP blocks 18, RAM blocks 20 and M-RAM blocks 22 are optional and are not required for the practice of the present invention.

For more information on the specific PLD architecture 10 illustrated in FIG. 1, see for example "The Stratix Architecture, Functional Description," pages 2-1 through 2-140, from the Altera Corporation, July, 2005 (Altera Internal document Number S51002-3.2) or "The Stratix® PII Architecture, Functional Description," pages 2-104, The Stratix® II Device handbook, Volume 1, December 2005 (Altera Document Number SII51002-4.0), both incorporated by reference herein for all purposes.

Figure 2:
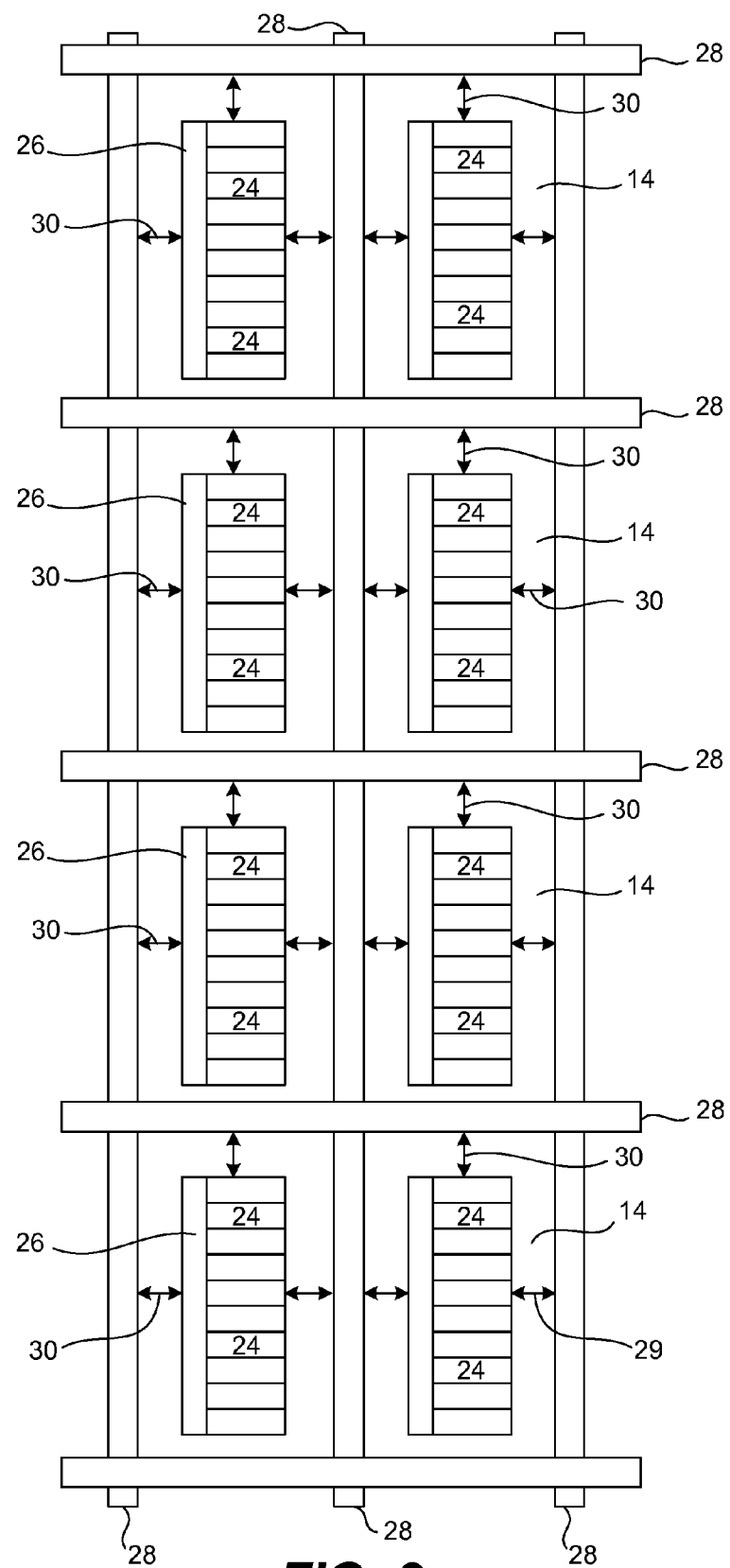
FIG. 2 is a diagram of a number of LABs interconnected by a plurality of vertical and horizontal inter-LAB lines according to the present invention.

Referring to FIG. 2, a block diagram of a number of LABs interconnected by a plurality of vertical and horizontal inter-LAB lines according to the present invention is shown. Each LAB 14 includes a plurality of logic elements 24. Local intra-LAB lines 26 are used to interconnect the individual logic elements 24 within each LAB 14. Vertical and horizontal inter-LAB lines 28 are used to interconnect the LABs 14 of the array. Routing drivers 30 (designated by double-sided arrows in the figure) are used to provide routing between the inter-LAB lines 28 and the local intra-LAB lines 26 of each LAB 14 respectively.

Figure 3:
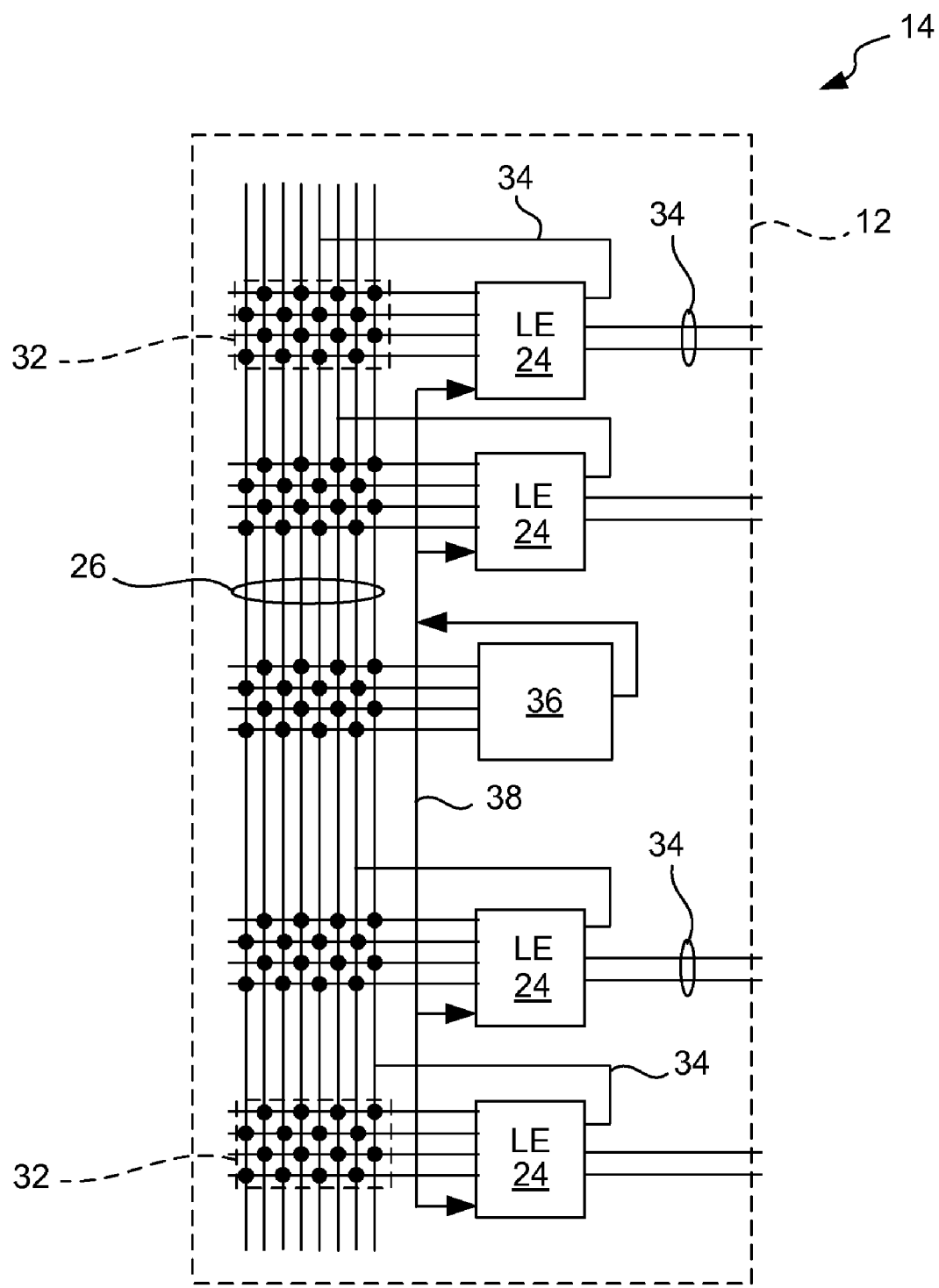
FIG. 3 is a diagram of a conventional LAB according to the prior art.

Referring to FIG. 3, a diagram of a conventional LAB according to the prior art is shown. A conventional LAB 14 includes a plurality of logic elements 24 interconnected by a plurality of LAB lines 26. As illustrated, the individual LAB lines 26 all have the same start and termination point at the top most and bottom most logic elements 24 respectively. A programmable interconnect pattern 32 is provided between the LAB lines 26 and the inputs to the logic elements 24. Each logic element 24 generates one or more outputs 34. The LAB 24 also includes one or more control signal generators 36, which generate control signals 38 that are distributed to each of the logic elements 24 within the LAB 14. In various embodiments, the control signals 38 include, but are not limited to, the following: clock signals, clock enable signals, clear signals and load signals. Since the individual LAB lines 26 and control signals 38 span only the logic elements 24 within the LAB 14, signals using the LAB lines 26 or control signals 38 can be routed only within the LAB 14. If a signal is to be routed to a logic element 24 in another LAB 14, the inter-LAB interconnects 28 must be used.

The programmable interconnect pattern 32 is made up of a plurality of programmable connections (as represented by black dots in the figures). A single programmable element is provided at the intersection of the inputs to the logic elements 24 and the LAB lines 26. According to various embodiments, the programmable connections may include multiplexers, pass transistors, configurable RAM storage cells, ROM storage cells, fuses, or any other known programmable elements used in the art. It should be noted that the pattern 32 shown in FIG. 2 is an example. Any suitable pattern of programmable interconnects may be used.

Figure 4:
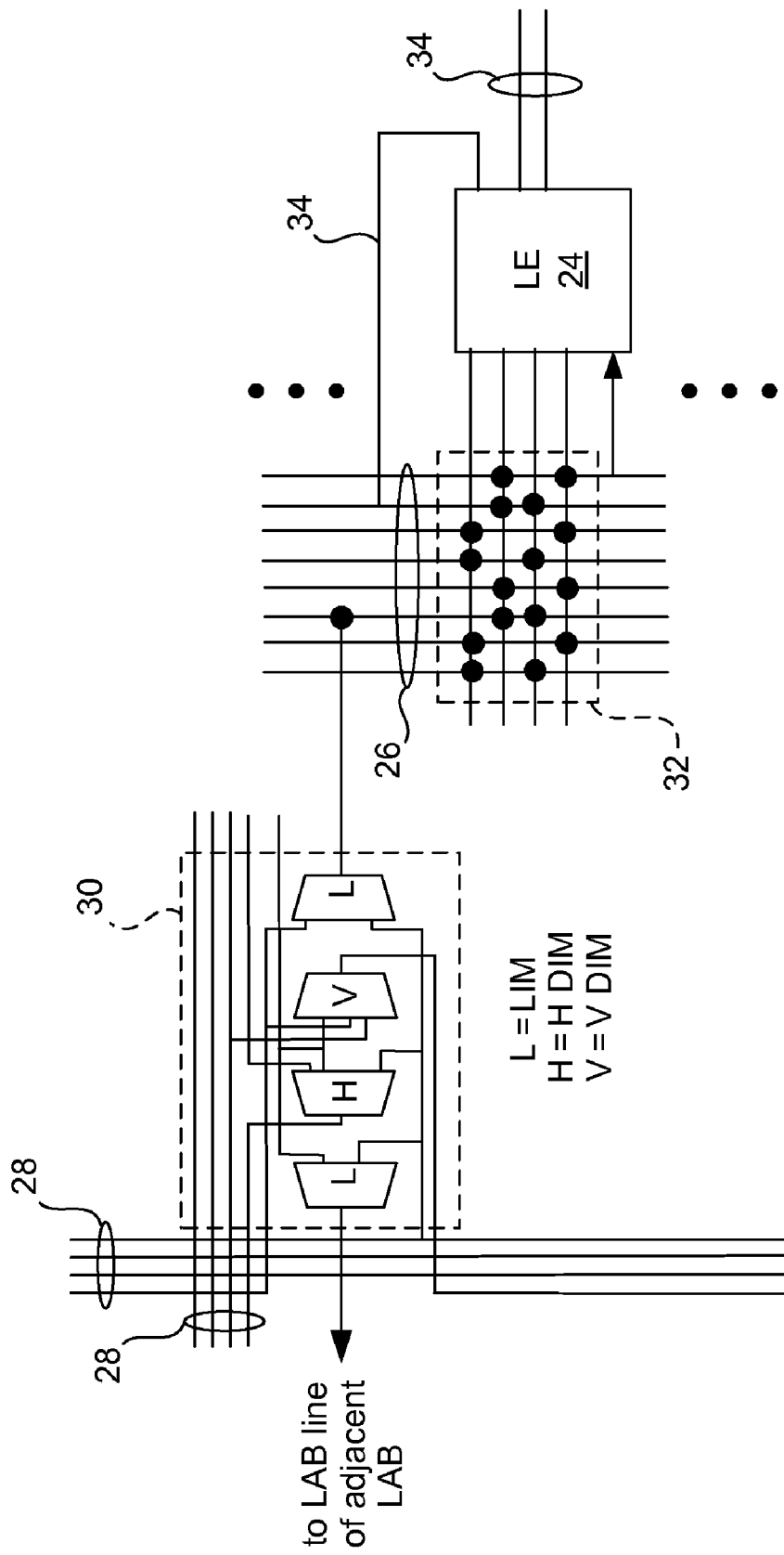
FIG. 4 illustrates a multiplexer arrangement for providing inputs to a LAB.

Referring to FIG. 4, a detailed diagram of connections of a set of routing drivers 30 is shown according to one embodiment of the invention. The routing drivers 30 include a number of LAB Input Multiplexers (LIMs) and Driver Input multiplexers (DIMs), each designated either with an "L" (i.e., LIM), "H" (i.e., Horizontal DIM) or "V" (i.e., Vertical DIM). The HDIM drives horizontal inter-LAB lines 28 and is capable of receiving inputs from some of logic elements 24 from the adjacent LABs 14 (i.e., the LABs 14 on the left and the right of the HDIM multiplexer), and other inter-LAB routing lines. The VDIM drives vertical inter-LAB lines 28 and is capable of receiving inputs from some of logic elements 24 in the adjacent LABs 14 and other inter-LAB routing lines. The two LIMs generate output signals to drive the adjacent left and right LABs 14 and each receive inputs from inter-LAB routing wires 28 and optionally the adjacent LABs 14 respectively.

Figure 5:
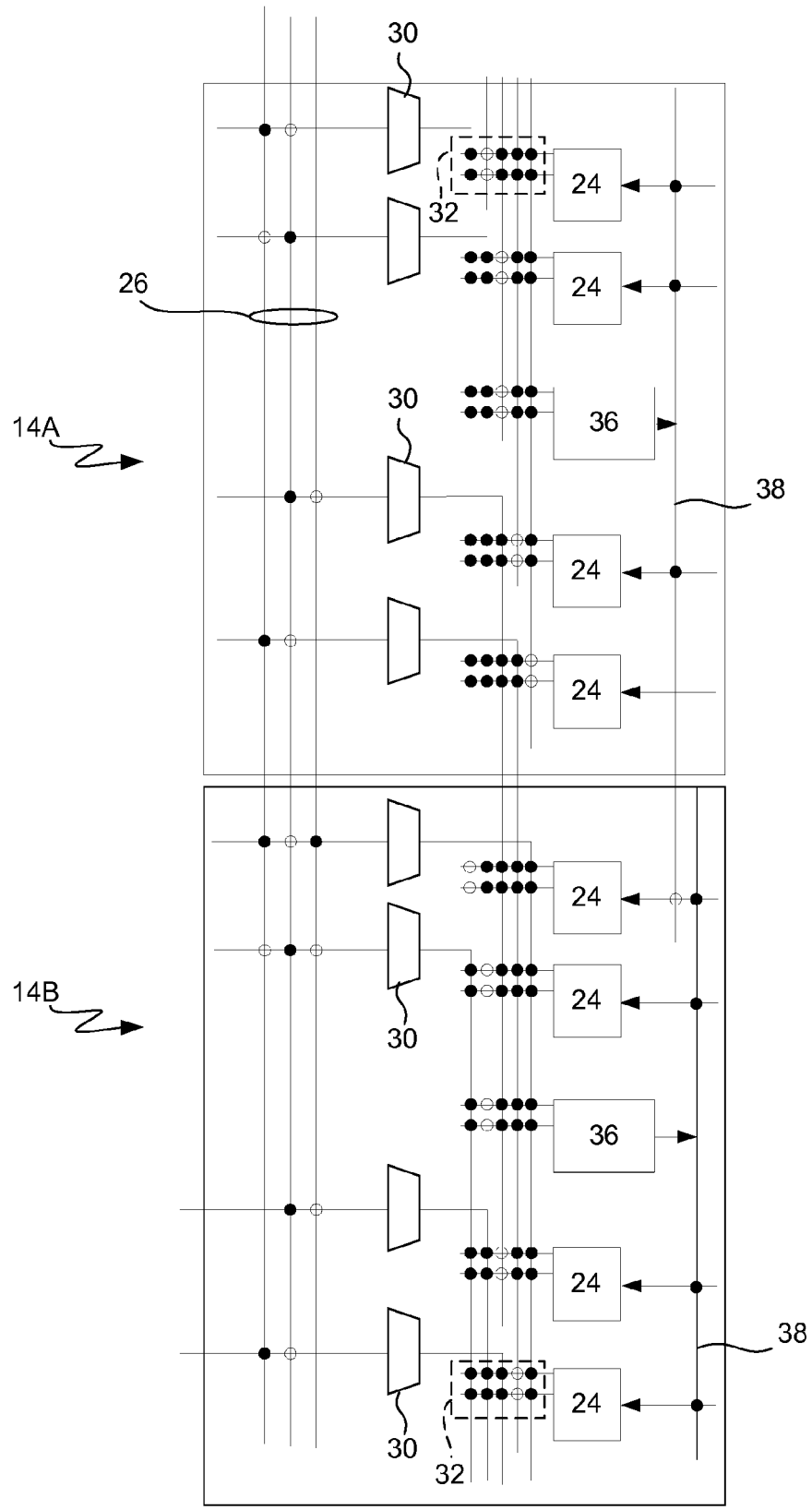
FIG. 5 is a logic diagram of two LABs according to one embodiment of the present invention.

Referring to FIG. 5, a logic diagram of two LABs for implementing redundancy with logic element granularity according to the present invention is shown. The diagram shows two adjacent LABs 14A and 14B, designated by the dashed lines around each. Both LAB 14A and 14B include a plurality of logic elements 24 and control signal generators 36, which generate control signals 38. LAB lines 26 are provided to connect the logic elements 24 and the control signal generators 36 of each LAB 14. A programmable interconnect pattern 32 is provided between the intra-LAB lines 26 and the inputs of each logic element 24. A LIM 30 receives inputs from the inter-LAB lines 28 and drives each of the LAB lines 26 respectively.

The programmable interconnect pattern 32 includes two types of programmable connections. The first, designated by solid black circles, indicate programmable connections that are visible to the user. The second, designated by non-solid circles, indicate programmable connections that are invisible to the user. The invisible programmable elements are used when redundancy is engaged, unbeknownst to the user.

To implement redundancy with logic element granularity, the following modifications are made to the LAB of FIG. 5 as compared to the same in FIG. 3:

(i) LAB lines 26 are staggered with respect to one another. The LAB lines 26 typically begin and end at the top most and the bottom most logic elements 24, such as found with conventional LABs. Since the LAB lines 26 are staggered with some specific pitch typically measured by a predetermined number of logic elements 24, some of the individual lines 26 have a starting point in one LAB and a termination point in an adjacent LAB. For more details on staggered LAB lines 26, see co-pending application U.S. Ser. No. 11/684,424 filed on Mar. 9, 2007 and entitled "A Programmable Logic Device Having Logic Array Interconnect Lines That Can Interconnect Logic Elements in Different Logic Blocks," assigned to the assignee of the present application, and incorporated herein for all purposes;

(ii) each LAB line 26 also includes a non-tail portion and a tail portion that extends the distance of one or more logic element 24 beyond the normal termination point of the line. In other words, if each LAB 14 includes four logic elements 24, and assuming a pitch of one logic element, the length of each line 26 would span a total of five logic elements including the tail. The non-tail portion of the line spans the first four logic elements 26. The tail portion spans the fifth logic element 24. The amount of tail extension will in general be the distance of shifting of logic elements when redundancy is engaged, defined as the redundancy pitch. The tail portion supports the shifting of logic elements 24 when implementing redundancy;

(iii) the programmable elements of the programmable interconnect pattern 32 include (i) user visible connection elements where the non-tail portion of a line 26 intersects the inputs of a logic element 14; and (ii) user invisible connection elements where the tail portion of the line intersects the inputs of the logic elements 14. For example, the tail portion of the first, second, third and fourth staggered lines 26 (from left to right) originating in LAB 14A coincide with the first, second, third and forth logic element 24 (from top to bottom) of LAB 14B respectively. At each of these locations, user invisible connection elements are provided, as designated by the non-solid circles. For the non-tail portion of these lines 26, user visible connections are used;

(iv) in situations where a tail portion of a line 26 terminates at a logic element above a control signal generator 36, the tail portion of the line is extended to include further logic elements 24 by the amount corresponding to the redundancy pitch of the LAB lines. User invisible connections are provided between the inputs of the control signal generator and the extended tail portion. See for example the user invisible non-solid circles provided at the intersection of the third line 26 (from left to right) and the second logic element 24 (from the top) and the inputs to the control signal generator 36 of LAB 14A; and (v) inter-LAB lines 28 require that each user-visible connection between routing multiplexers have corresponding connections between the redundancy pitch shifted versions of both the source and destination of that element. That is, if a logic element 24 in row i can be programmably connect to another logic element in row j, then the following two conditions must also be met. First, the former element must also be able to drive the corresponding logic element in row j+pitch. This is the function served by the connections in the tail referred to above. Second, the corresponding element in row i+pitch must be able to drive the corresponding element in row j+pitch. This allows each routing resource to be replaced by a corresponding one in the shifted row. The properties of the connectivity are similar to those in U.S. Pat. No. 7,180,324 except applied to the LAB line pitch level. For example, if a horizontal inter-LAB line can drive a vertical inter-LAB line in some logic element row, then the corresponding horizontal inter-LAB line in the shifted logic element row must be able to drive a corresponding vertical inter-LAB line in the shifted logic element row.

Figure 6:
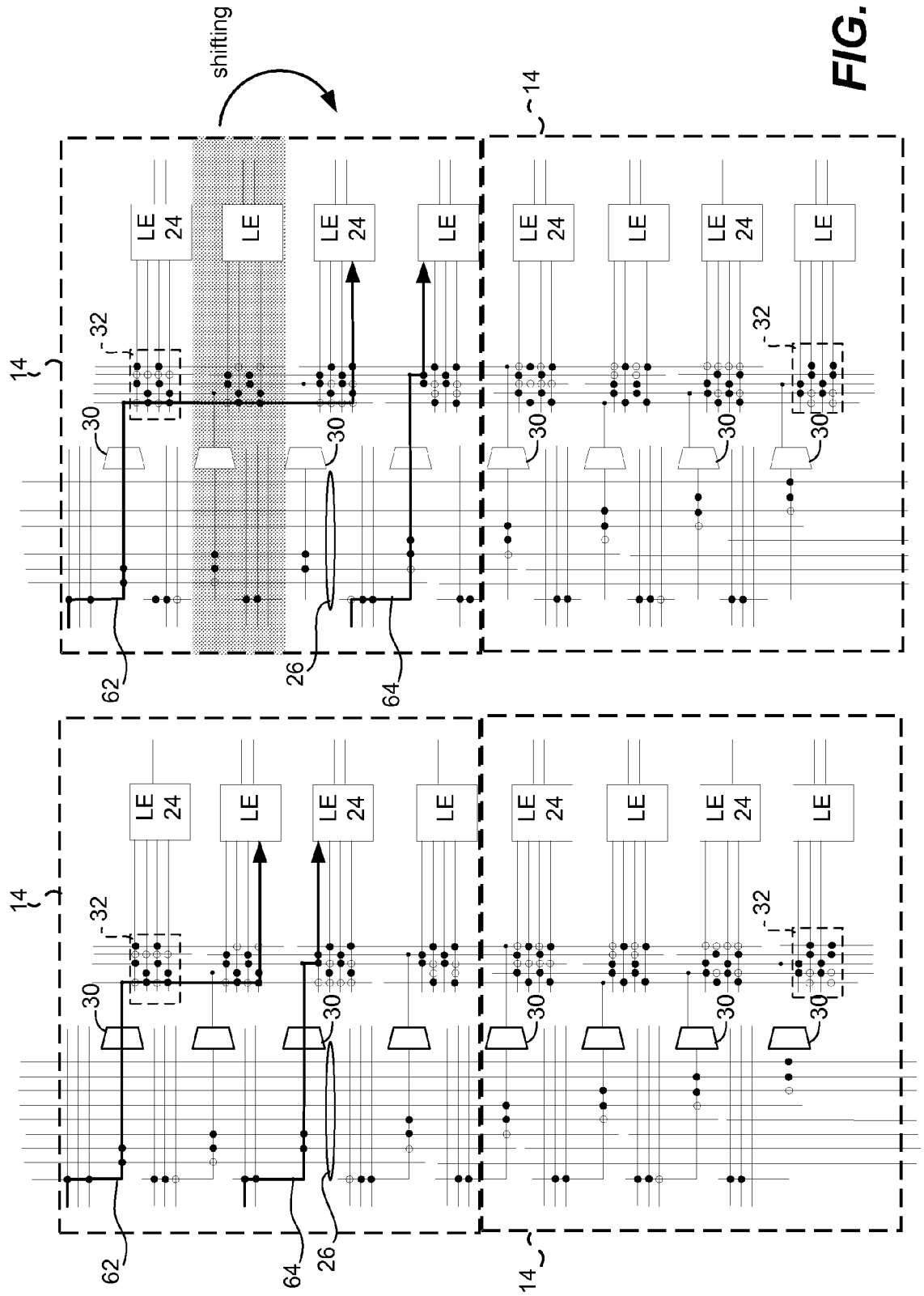
FIG. 6 is a logic diagram of four LABs according to another embodiment of the present invention.

FIG. 6 shows the operation of redundancy in more detail. In contrast to FIG. 5, the LIMs 30 in each row do not have identical connectivity to the logic elements spanned by the LAB lines that they drive. This requires extra redundant connections beyond the tail connections described above.

The left side of the diagram of FIG. 6 shows a number of LIMs 30 and logic elements 24, together with two example routing paths 62 and 64. The control signal generators 36 and control signals 38 are deleted from the left and rights diagrams for the sake of simplification. The left side of the diagram shows the routing of paths 62 and 64 when redundancy is not implemented. The right side, however, shows the re-routing of the signals in the situation where the second row is defective and redundancy is engaged. In this case every logic element 24 and routing resource in the second row and below is replaced by the one immediately below it, shifting each resource down by one logic element row. The top signal 62, which has a source that is above the defective row, continues to use the same routing elements, and so the shifting of the defective routing path uses the same intra-LAB line, but engages the routing switch in the row below. Although this could be either a user-visible or redundant switch in general, in this particular case redundancy engages a redundant switch for the connection from the intra-LAB routing to the input of the logic element.

In the second routing path 64, the source of the routing path is below the defective row, so the shifting causes the routing path to use different elements. Thus the shifting causes the signal routed on a horizontal wire to shift down to a corresponding horizontal wire in the logic element row below. In this particular example redundant routing switch is used to provide a connection from the horizontal wire to the LIM 30. A consequence of using the LIM in the row below is that the signal is routed on a different intra-LAB wire, so the path uses a connection from the shifted inter-LAB wire to the input of the logic element. In this particular case a user-visible switch is provided, but again either a user-visible or redundant switch could be engaged depending on the details of the routing pattern.

In this example a shifting amount of one logic element 24 is applied. It can be seen that other shift amounts larger than one logic element 24 could be used as well, and may be desirable based on other factors to be explained later.

Although the DIMs that drive the inter-LAB routing wires are not shown in the FIG. 6, the connectivity requirements for the DIMs would be similar as described above.

It should be noted that the diagrams of FIGS. 5 and 6 have been simplified to better illustrate the features of the present invention. For better visibility, a reduced number of LAB lines 26 and inputs of each logic element 24 are shown. In various embodiments of the present invention, additional lines 26 and the number of inputs to each logic element 24 may be used with the same design principles described above for implementing logic element level redundancy.

FIG. 5 illustrates that is possible to reduce the cost of redundancy by providing LAB and local line groups that have a LIM 30 in every row that connects to that group, eliminating the extra redundant LIM 30, and only needing an extra connection on the redundant tail. Thus, if a LIM in one row is defective, all logic at or below that row can be shifted down to the next row and there will be a corresponding LIM 30 that can drive all the logic elements that the former LIM 30 was capable of driving. However, this is not a requirement and connectivity patterns that do not have these patterns can also be defined at a cost of extra redundant switches, as shown in FIG. 6. As described above, the essential requirement is that in the case of a defect, all logic is shifted down by the specified redundancy pitch of the LAB lines 26, and there is a corresponding programmable connection between the corresponding LAB interconnect 26 and corresponding logic element 24.

With conventional LABs 14, there is only one control signal generator 36 per LAB 14. The conventional arrangement has consequences when implementing logic element level redundancy. First, the control signal generators 36 are not repairable since there is no second control signal generator to replace the first. Furthermore, it is unpredictable if the top logic element 24 will need to receive a control signal 38 from its own LAB 14, or redundantly from the LAB above it. The aforementioned issues can be overcome using either software or a hardware approach.

In a software approach, the programming software used in cooperation with the PLD 10 enforces a restriction that the bottom-most logic element 24 in each LAB 14 cannot use any control signal 38. Thus, shifting the bottom logic element 24 into the next LAB does not require access to any unavailable control signals 38, and the user-invisible connection in the LAB 14B is not required. This approach has a disadvantage with certain user circuits, such as counters, which require contiguous logic elements, each having access to a common clock signal. Such user designs are therefore more difficult to implement. Alternatively, the software can be modified to enforce a restriction that each LAB 14 in the array, or the logic elements 24 that are possibly shifted in a defective device, have access to the control signals 38 required by the shifted logic elements and their above neighbors. To support this, it is necessary to provide redundancy hardware such that at least the top logic element in a LAB (or the number of logic elements corresponding to the redundancy pitch) has access to the secondary signals from both this LAB and the LAB above. These approaches may be combined, since it may be more difficult to enforce the various software restrictions for some of the secondary signals compared to others. For example, when a LAB 14 is configured to implement a counter, the same clock typically feeds all the logic elements 24. In this circumstance, it is not desirable to restrict the bottom logic element 24 from using a clock. This may be supported either with extra hardware, or by enforcing each LAB 14 to have access to both its own clocks as well as the clock signals used by the LAB directly above. Since there are typically a few clock signals provided per LAB 14, it may be possible to use this advantageously to reduce the number of clocks generated in each LAB 14, but to allow logic elements 24 that may be used as redundant elements to access the derived secondary signal clocks from two LABs 14.

Figure 7:
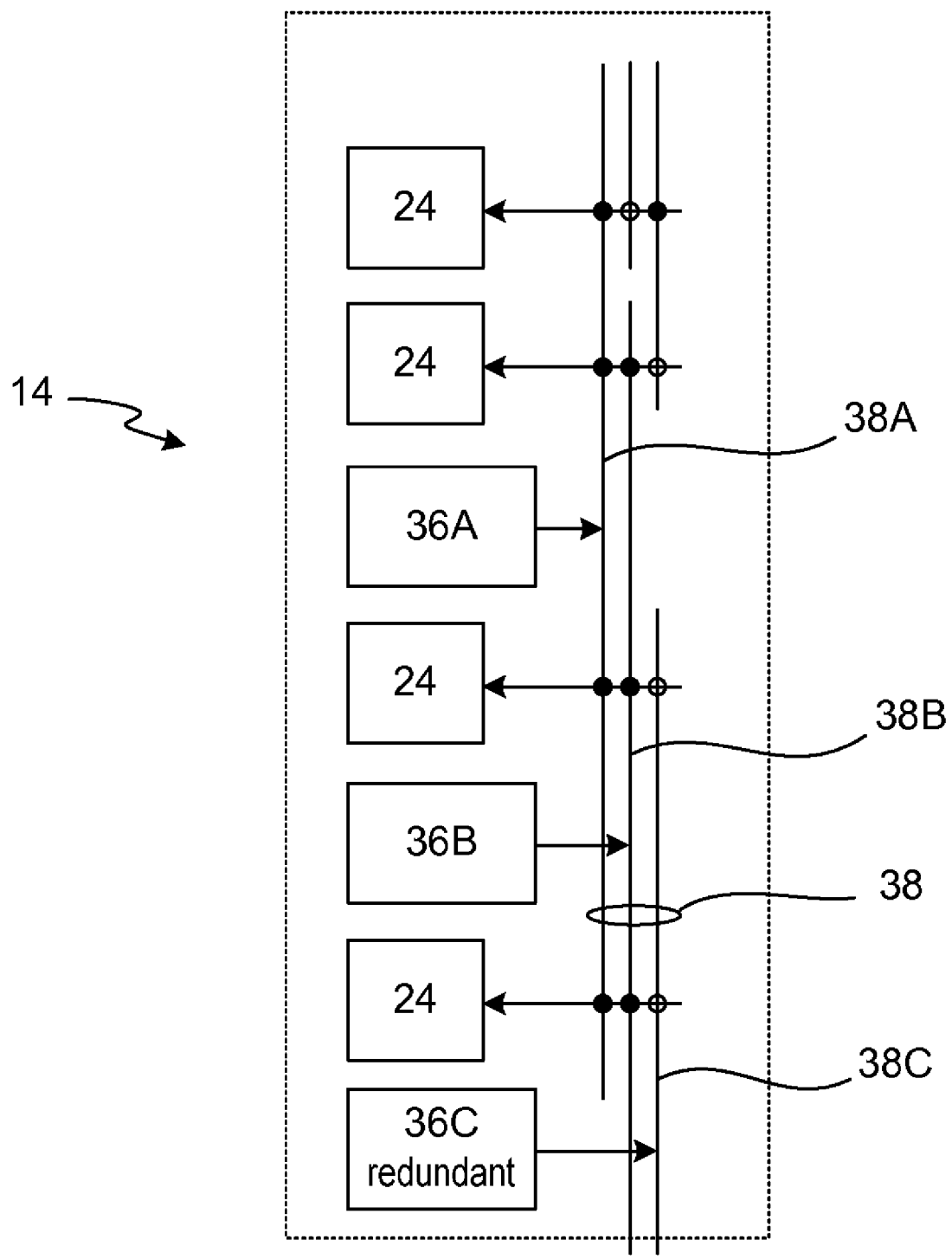
FIG. 7 is a logic diagram of a LAB according to another embodiment of the present invention.

Referring to FIG. 7, a hardware approach to resolving the issues related to distributing control signals in a LAB using logic element redundancy is shown. The LAB 14 includes a plurality of logic elements 24, a first control signal generator 38A, a second control signal generator 38B, and a redundant control signal generator 38C. The control signals generators 38A, 38B and 38C generate control signals 38A, 38B and 38C respectively. Solid circles and non-solid designate user visible connections and user invisible connections respectively between the controls signals 38A, 38B and 38C and the individual logic elements 24 of the LAB 14 respectively.

The two control signal generators 36A and 36B define control signal generator slices, each of which provides control signals to a subset or "slice" of the logic elements 24 of the LAB. For example, the control signal generator 36A, provides control signal 38A to a set of logic elements 24, which in this example include the top four logic elements 24. The control signal generator 36B also provides control signal 38B to a set of logic elements 24, which in this case include the second, third and forth logic elements 24 of the LAB 14 shown in FIG. 6 and the first logic element of the LAB below (not shown). The redundant generator 36C, which generates signal 38C, defines a slice of the bottom two logic elements 24 of the LAB 14 shown and the top two of the LAB below. Generators 36A, 36B and 36C are at least capable of providing the same type of control signals, such that 36B may replace 36A, and that 36C may replace 36B.

The redundant control signal generator 38C is provided for redundancy. For example, consider a conventional control signal generator 36 that provides two clock signals to each of the logic elements 24 in the LAB 14. With the embodiment of FIG. 6, the control signal generator functionality is divided into two smaller generators 36A and 36B and a redundant generator 36C, each of which provides one clock signal. By using the redundant generator 36C and the invisible connections, the logic elements 24 within the redundant slice may receive the redundant control signal.

In an embodiment where the number of control signal generator slices equals the number of logic elements 24 per LAB 14, then the need for a redundant control signal generator slice is eliminated. The control signal slice is thus considered to be part of the logic element, using a distinct set of local lines to broadcast the control signals 38. In general, this will be true if the control signal generators are located on the same pitch as the redundancy pitch, which may motivate a redundancy pitch larger than one, as referred to earlier.

In embodiments where there are fewer control signal generators 38 than logic elements 14, another variation may be used to reduce the overhead associated with redundancy. A set of control signal generator slices may be defined such that each slice provides for the selection and conditioning functions of one signal, or in the case of a slice that is used redundantly, the union of two functions. For example, suppose that a LAB 14 has two clear signals and two clock signals. By providing four slices, two of which provide both clock and clear functions, and one each of clock and clear functions, it is possible to ensure that a defective slice that provides only one function is shifted into the slice which is capable of providing both functions. Specifically, the signal generators would be placed in the order clock and clear, clock, clock and clear, clear, from top to bottom, and the top two would be allocated to clock functions only, and the bottom two to clear functions only. Thus if the functions were shifted, it would always be to a signal generator capable of producing the desired signal. Alternatively, if the redundancy pitch is such that the control signal generators provide each desired functions occupy all possible locations on the same pitch, then no extra generators are required. This may motivate a redundancy pitch larger than one as alluded to earlier.

With both LAB lines 26 and control lines 38 staggered and extending from one LAB 14 to the next, the boundary of what defines a LAB becomes blurred. It could be said that the PLD architecture as described herein includes only on logic element 24 per LAB 14. However, the presence of slices defined by control signal generators 36, which are periodically repeated, can be used to define the boundary of one LAB from the next. Thus the boundary of the LABs 14 have nearly vanished from a routing perspective, but rather can be defined by the shared functionality of control signals among a group of logic elements 14.

As noted in the Background of the Invention, having smaller redundant regions means that the overhead required for redundant logic is decreased, thereby lowering costs. The lowered cost of providing redundancy translates into increase yields. For example, a PLD with thirty rows might include two redundant rows using LAB level redundancy, or a 6.7% overhead. In comparison, the same PLD with five redundant rows using the logic element redundancy scheme of the present invention, the overhead is reduced to 1.7% (assuming the LABs include eight logic elements and one control signal generator having an area 1.5 times a logic element equivalent). In addition, the present invention allows up to five defects to be repaired versus two in the LAB level redundancy scheme. Lastly, with the present invention, since each redundancy region is smaller, it is less likely that two faults or defects will occur in a single region, making the die unrepairable. In general, the optimal number of redundant regions will be larger for logic element level redundancy, achieving lower cost and better repair rates.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, while the present invention has been described in terms of row redundancy, it also can be implemented using column redundancy. It is therefore intended that the invention be interpreted to include all variations and equivalents that fall within the true spirit and scope of the present invention.

What is claimed is:

1. An apparatus, comprising:
   a programmable logic device, the programmable logic device including:
      a plurality of LABs arranged in an array; and
      a plurality of horizontal and vertical inter-LAB lines interconnecting the LABs of the array,
   wherein each of the LABs further include:
      a predetermined number of logic elements; and
      redundancy circuitry to replace a defective logic element with a non-defective logic element among the predetermined logic elements by shifting programming data intended for the defective logic element to the non-defective logic element.

2. The apparatus of claim, 1, wherein the redundancy circuitry includes a plurality of LAB lines, the LAB lines including:
   (i) a non-tail portion; and
   (ii) a tail portion that extends a distance of one or more logic elements past the nominal end of the line to support the redundant shifting of the redundant logic element in place of the defective logic element.

3. The apparatus of claim 2, wherein the plurality of the LAB lines are staggered, each of the staggered lines having user visible programmable connections associated with the non-tail portion of the line and user invisible programmable connections associated with the tail portion of the line respectively.

4. The apparatus of claim 2, wherein the staggered LAB lines have a starting point in a first LAB and terminate at the tail in a second LAB respectively.

5. The apparatus of claim 2, further comprising one or more programmable connections provided at the intersection of the plurality of LAB lines and inputs of the predetermined number of logic elements respectively, the programmable connections capable of selectively connecting the intersecting LAB lines and the inputs to the logic elements respectively.

6. The apparatus of claim 5, wherein the programmable connections are either:
   (i) user-invisible where the inputs to the logic elements intersect the tail portion of the LAB lines respectively, the user invisible programmable connections being used to employ redundancy; or
   (ii) user-visible where the inputs to the logic elements intersect the non-tail portion of the inter-LAB lines respectively.

7. The apparatus of claim 2, wherein the plurality of LAB lines are staggered and define a pitch with respect to one another, the amount of the pitch ranging from one to eight logic elements.

8. The apparatus of claim 1, further comprising programmable Driver Input Multiplexers (DIMs) for programmably connecting the horizontal and vertical inter-LAB lines and LABs, the DIMs being programmable to provide routing between the LABs in the array.

9. The apparatus of claim 1, wherein each of the LABs further includes a control signal generator for generating a set of control signals in each LAB respectively, the set of control signals being programmably distributed to all the predetermined number of logic elements within the LAB, except a pre-designated logic element in the LAB.

10. The apparatus of claim 1, wherein each LAB further includes:
- a first control signal generator for generating a first set of control signals, the first set of control signals being selectively connected by user visible programmable interconnects to one or more of the predetermined number of logic elements in the LAB respectively; and
- a redundant control signal generator for generating a redundant set of control signals, the redundant set of control signals being connected by user invisible programmable interconnects to one or more of the predetermined number of logic elements in the LAB when redundancy is implemented respectively.

11. The apparatus of claim 10, wherein each LAB further comprises a second control signal generator for generating a second subset of control signals, the second set of control signals being selectively connected by second user visible programmable interconnects to one or more of the predetermined number of logic elements in the LAB respectively.

12. The apparatus of claim 1, wherein each LAB further comprises a predetermined number of control signal generators associated with the predetermined number of logic elements respectively.

13. The apparatus of claim 1, wherein each LAB further comprises:
- a first control signal generator capable of generating a set of control signals which are programmably connected to one or more of the predetermined number of logic elements; and
- a second control signal generator capable of generating a redundant set of the control signals, one or more of the redundant set of the controls signals being used either:
  - (i) in place of one or more of the set of control signals when implementing redundancy; or
  - (ii) as one or more of a second set of control signals when not implementing redundancy.

14. The apparatus of claim 1, wherein each LAB further comprises:
- a first control signal generator configured to generate a first set of control signals, the first set of control signals being distributed to a first set of logic elements defining a first slice; and
- a second control signal generator configured to generate a second set of control signals, the second set of control signals being distributed to a second set of logic elements defining a second slice.

15. The apparatus of claim 14, wherein the first set of logic elements defining the first slice are staggered relative to the second set of logic elements defining the second slice.

16. The apparatus of claim 14, wherein the first set of logic elements defining the first slice span between two adjacent LABs in the array.

17. The apparatus of claim 14, wherein one or more of the logic elements of the first set defining the first slice are in common with one or more of the logic elements defining the second slice.

18. The apparatus of claim 1, wherein the redundancy circuitry is further configured to shift the programming data for routing so that programming data can be shifted from the defective logic element to the non-defective logic element.

* * * * *